United States Patent
Engelhardt

(10) Patent No.: US 9,613,848 B2
(45) Date of Patent: Apr. 4, 2017

(54) DIELECTRIC STRUCTURES WITH NEGATIVE TAPER AND METHODS OF FORMATION THEREOF

(71) Applicant: Infineon Technologies AG, Neubiberg (DE)

(72) Inventor: Manfred Engelhardt, Villach-Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/621,082

(22) Filed: Feb. 12, 2015

(65) Prior Publication Data

US 2016/0240429 A1    Aug. 18, 2016

(51) Int. Cl.
H01L 21/76       (2006.01)
H01L 21/762      (2006.01)
H01L 21/311      (2006.01)
H01L 21/02       (2006.01)
H01L 21/3105     (2006.01)

(52) U.S. Cl.
CPC .. *H01L 21/76227* (2013.01); *H01L 21/02129* (2013.01); *H01L 21/3105* (2013.01); *H01L 21/31116* (2013.01); *H01L 21/31144* (2013.01)

(58) Field of Classification Search
USPC .................................................. 438/427, 424
See application file for complete search history.

(56) References Cited

U.S. PATENT DOCUMENTS

| | | | |
|---|---|---|---|
| 5,017,509 A | 5/1991 | Tuckerman | |
| 5,545,590 A | 8/1996 | Licata | |
| 6,077,761 A | 6/2000 | Chen et al. | |
| 6,156,672 A | 12/2000 | Koshido et al. | |
| 6,214,698 B1 * | 4/2001 | Liaw | H01L 21/76224 257/520 |
| 7,141,486 B1 | 11/2006 | Rossi et al. | |
| 7,309,659 B1 | 12/2007 | Subramanian et al. | |
| 7,486,867 B2 | 2/2009 | Wang | |
| 2001/0026980 A1 * | 10/2001 | Mizuo | H01L 21/3065 438/296 |
| 2002/0192897 A1 | 12/2002 | Molloy et al. | |
| 2007/0066074 A1 | 3/2007 | Rossi et al. | |
| 2009/0045482 A1 * | 2/2009 | Liaw | H01L 21/82387 257/510 |
| 2012/0322267 A1 | 12/2012 | Engelhardt | |
| 2013/0023124 A1 | 1/2013 | Nemani et al. | |

OTHER PUBLICATIONS

Hu, C. C., "Chapter 3: Device Fabrication Technology," Modern Semiconductor Devices for Integrated Circuits, Mar. 22, 2009, pp. 59-88.

Sekine, M., "Dielectric film etching in semiconductor device manufacturing Development of SiO2 etching and the next generation plasma reactor," Applied Surface Science, vol. 192, May 30, 2002, pp. 270-298.

* cited by examiner

*Primary Examiner* — Timor Karimy

(74) *Attorney, Agent, or Firm* — Slater Matsil, LLP

(57) ABSTRACT

A method for forming a dielectric structure includes forming an auxiliary layer over a substrate, and forming a hole within the auxiliary layer. A fill material is deposited into the hole. The auxiliary layer is removed to form the dielectric structure having a negative taper. The dielectric structure has a top critical dimension greater than a bottom critical dimension.

18 Claims, 18 Drawing Sheets

DIELECTRIC STRUCTURES WITH NEGATIVE TAPER AND METHODS OF FORMATION THEREOF

TECHNICAL FIELD

The present invention relates generally to semiconductor fabrication, and, in particular embodiments, to dielectric structures with negative taper and methods of formation thereof.

BACKGROUND

Semiconductor devices are used in a variety of electronic and other applications. Semiconductor devices comprise, among other things, integrated circuits or discrete devices that are formed on semiconductor wafers by depositing one or more types of thin films of material over the semiconductor wafers, and patterning the thin films of material to form the integrated circuits.

Silicon oxide is used as an insulating layer in many such applications. For example, silicon oxide is frequently used as pre-metal dielectric (PMD) layer below the metallization layer and above the active device regions.

Silicon oxide is typically deposited by thermal oxidation or by using a chemical vapor deposition (CVD) process or a plasma enhanced CVD process. After depositing silicon oxide, it is usually etched to form a patterned structure. The etching may be performed using wet etching, which is usually isotropic. Anisotropic features in the deposited oxide are generally fabricated using plasma etching such as reactive ion etching.

SUMMARY

In accordance with an embodiment of the present invention, a method for forming a dielectric structure comprises forming an auxiliary layer over a substrate, and forming a hole within the auxiliary layer. A fill material is deposited into the hole. The auxiliary layer is removed to form the dielectric structure having a negative taper. The dielectric structure has a top critical dimension (CD) greater than a bottom CD.

In accordance with an embodiment of the present invention, a method for forming a dielectric structure includes forming a hole within an auxiliary layer. The hole has positive tapered sidewalls. A doped oxide is deposited into the hole and contacts the hole. The auxiliary layer is removed to form a structured fill material having negative tapered sidewalls.

In accordance with an embodiment of the present invention, a method for forming a dielectric structure includes forming an auxiliary layer over a substrate, and forming a first hole within the auxiliary layer. The first hole extends partially into the auxiliary layer to a first depth. A second hole is formed within the first hole. The second hole extends deeper into the auxiliary layer than the first hole. The fill material is deposited into the first hole and the second hole. The auxiliary layer is removed to form a structured fill material having a negative taper.

BRIEF DESCRIPTION OF THE DRAWINGS

For a more complete understanding of the present invention, and the advantages thereof, reference is now made to the following descriptions taken in conjunction with the accompanying drawings, in which:

FIGS. 8A and 8B illustrate the fabricated dielectric structure, wherein FIG. 8A illustrates a cross-sectional view of the semiconductor device during fabrication after removing the auxiliary layer in accordance with an embodiment of the present invention, and wherein FIG. 8B illustrates a corresponding top view of the semiconductor device;

DETAILED DESCRIPTION OF ILLUSTRATIVE EMBODIMENTS

Conventional features have positive taper, in other words, the dimension of the feature decreases from the bottom to the top, where top is the portion facing away from a supporting substrate. However, for some applications, dielectric structures with negative taper are needed. In a dielectric structure with a negative taper, the dimension of the feature increases from the bottom to the top (portion facing away from the supporting substrate) so that the top critical dimension (CD) is greater than the bottom CD. There are no conventional methods to form dielectric structures with negative taper.

Embodiments of the present invention will be used to form dielectric features having negative taper. Advantageously, embodiments of the present invention provide a cost effective way to produce such structures.

Figure 1:
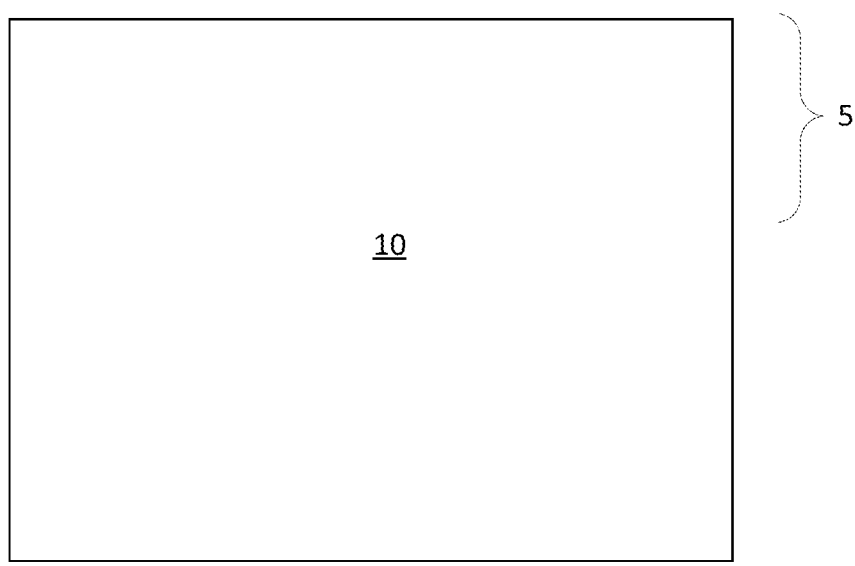
FIG. 1 illustrates a cross sectional view of a semiconductor device during fabrication after the formation of doped regions and optionally with one or more metallization layers in accordance with an embodiment of the present invention.

FIG. 1 illustrates a cross sectional view of a semiconductor device during fabrication after the formation of doped region and optionally with one or more metallization layers in accordance with an embodiment of the present invention.

FIG. 1 illustrates a cross sectional view of a substrate 10 with an auxiliary layer 20 formed over. The substrate 10 may be a semiconductor substrate comprising doped regions formed within. In some embodiments, the substrate 10 may include metallization layers for interconnecting the doped regions and provide external contacts to the devices within the substrate 10. Accordingly, the substrate 10 may contain active circuitry disposed inside it. The active circuitry may be formed in and/or over a substrate 10 and includes the active device regions 5 that may include transistors, resistors, capacitors, inductors or other components used to form integrated circuits. The active areas may also include other structures such as isolation regions, for example, the active areas may include transistors (e.g., CMOS transistors and/or bipolar transistors) separated from one another by isolation regions, e.g., shallow trench isolation.

Next, metallization (if present) is disposed over the active device regions 5 to electrically contact and interconnect the active devices. The metallization and active device regions 5 together form a completed functional integrated circuit. In other words, the electrical functions of the semiconductor chip can be performed by the interconnected active circuitry. In logic devices, the metallization may include many layers, e.g., nine or more, of copper or alternatively of other metals. In memory devices, such as DRAMs, the number of metal levels may be less and may be aluminum. The active device regions 5 may also form part of a discrete device, in which case, the number of levels of metal lines is minimal.

In various embodiments, the substrate 10 may be formed on a silicon substrate. Alternatively, in other embodiments, the substrate 10 may have been formed on silicon carbide (SiC). In one embodiment, the substrate 10 may have been formed at least partially on gallium nitride (GaN). For example, the substrate 10 may comprise a lateral transistor formed on GaN on silicon. In another embodiment, the substrate 10 may comprise a vertical transistor formed on GaN on bulk GaN substrate. In alternative embodiments, the substrate 10 may comprise semiconductor on insulator substrates such as SOI as well as compound semiconductors such as GaAs, InP, InSb, SbInP, and others.

The substrate 10 may include epitaxial layers including heteroepitaxial or homoepitaxial layers. Some examples of the substrate 10 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-INF insulator (GeOI) wafer. In other embodiments, other semiconductors such as silicon germanium, germanium, gallium arsenide, indium arsenide, indium gallium arsenide, indium antimonide, or others can be used as the substrate 10.

Figure 2:
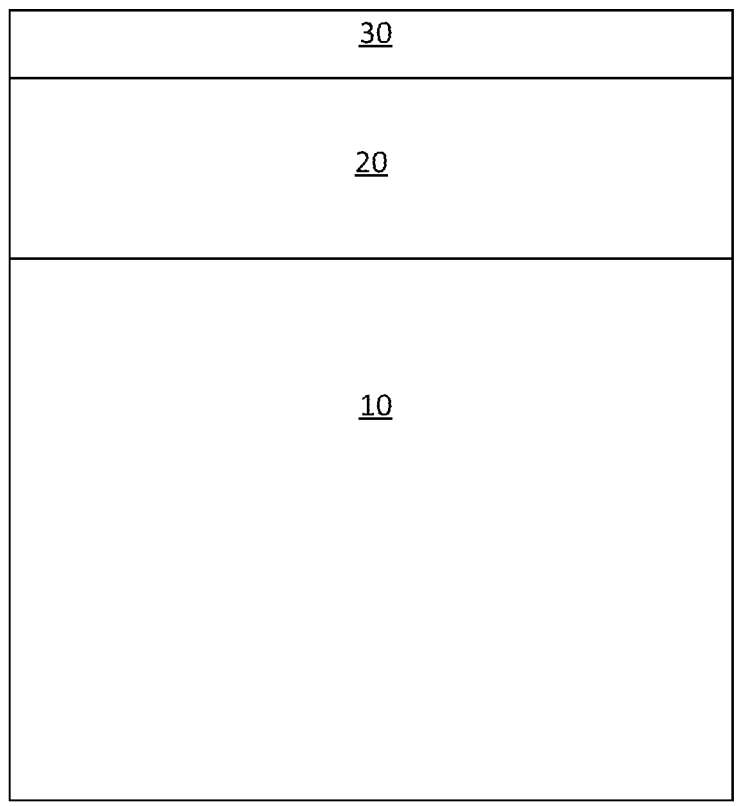
FIG. 2 illustrates a cross sectional view of a substrate after forming an auxiliary layer over the substrate in accordance with an embodiment of the present invention.

FIG. 2 illustrates a cross sectional view of a substrate after forming an auxiliary layer over the substrate in accordance with an embodiment of the present invention.

In various embodiments, the auxiliary layer 20 is configured to be selectively removed relative to the patterned feature having negative taper that is being formed. In various embodiments, the auxiliary layer 20 comprises an insulating material. For example, the auxiliary layer 20 comprises $SiO_2$ such as tetra ethyl orthosilicate (TEOS) or fluorinated TEOS (FTEOS) based oxides including doped silicates glass, organo silicate glass (OSG), carbon doped oxides (CDO), fluorinated silicate glass (FSG), spin-on glass (SOG), or low-k insulating materials, e.g., having a dielectric constant of about 4 or less, or dielectric diffusion barrier layers or etchstop layers such as silicon nitride (SiN), silicon oxynitride (SiON), silicon carbide (SiC) or silicon carbo nitride (SiCN), e.g., having a dielectric constant of about 4 or higher or combinations or multiple layers thereof, as examples, although alternatively, the auxiliary layer 20 may comprise other materials. The auxiliary layer 20 may also comprise dense SiCOH or a porous dielectric having a k value of about 3 or lower, as examples. The auxiliary layer 20 may also comprise an ultra-low-k (ULK) material having a k value of about 2.3 or lower, for example.

In other embodiments, the auxiliary layer 20 may also comprise amorphous materials such as amorphous carbon and other semiconductor layer such as SiGe or Germanium that can be selectively removed relative to the substrate 10 and the negatively tapered structure being formed.

In other embodiments, the auxiliary layer 20 may also organic materials such as polymers, molding compounds, resins, and others. In one or more embodiments, the auxiliary layer 20 may comprise one or more of a polymer, a copolymer, a biopolymer, a fiber impregnated polymer (e.g., carbon or glass fibers in a resin), a particle filled polymer, and other organic materials. In one or more embodiments, the auxiliary layer 20 comprises a sealant not formed using a mold compound, and materials such as epoxy resins and/or silicones. In various embodiments, the auxiliary layer 20 may be made of any appropriate duroplastic, thermoplastic, a thermosetting material, laminate, epoxy material, and others.

A photo resist layer 30 is deposited over the auxiliary layer 20. The photo resist layer 30 comprises a positive resist layer in which the portion of the photo resist layer 30 exposed to the light beam through a mask becomes soluble to the photoresist developer. In various embodiments, the photo resist layer 30 may comprise one or more of poly methyl methacrylate (PMMA), poly methyl glutarimide (PMGI), phenol formaldehyde resin, and others. The photo resist layer 30 may be formed by depositing a photo resist material on a region over the substrate 10 followed by spinning.

Figure 3:
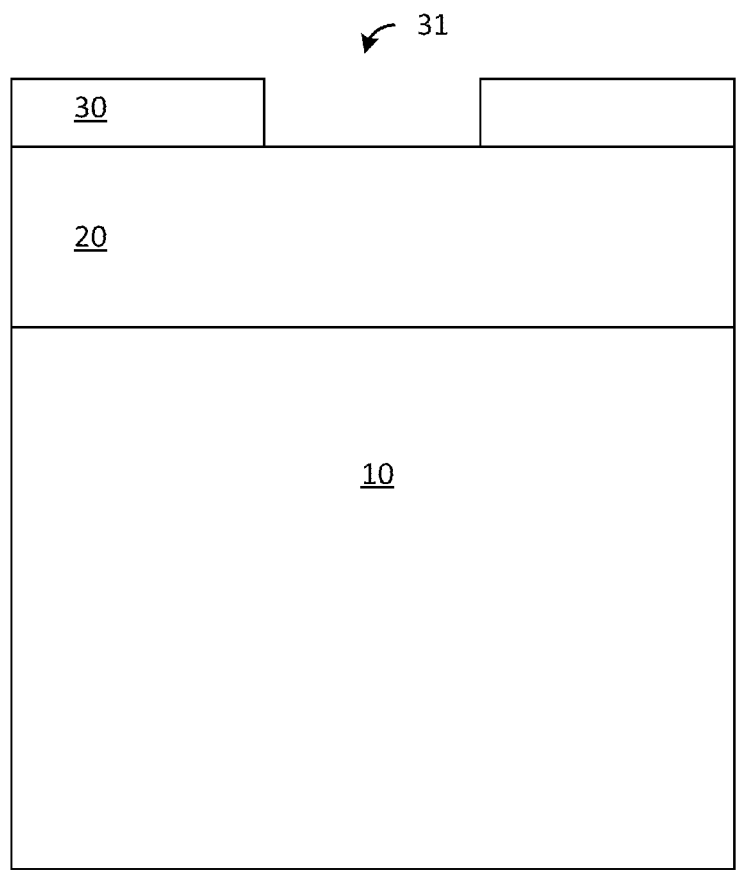
FIG. 3 illustrates a cross-sectional view of the semiconductor device during fabrication after patterning the photo resist material in accordance with an embodiment of the present invention.

FIG. 3 illustrates a cross-sectional view of the semiconductor device during fabrication after patterning the photo resist material in accordance with an embodiment of the present invention.

Referring to FIG. 3, the photo resist layer 30 is patterned to form one or more openings 31 in the photo resist layer 30. In one or more embodiments, a conventional lithography process may be used to pattern the photo resist layer 30. In case of a positive resist, the region exposed to radiation is dissolved with a developer forming the one or more openings 31. Alternatively, in case of a negative resist, the region not exposed to radiation is dissolved with a developer forming the one or more openings 31.

Figure 4:
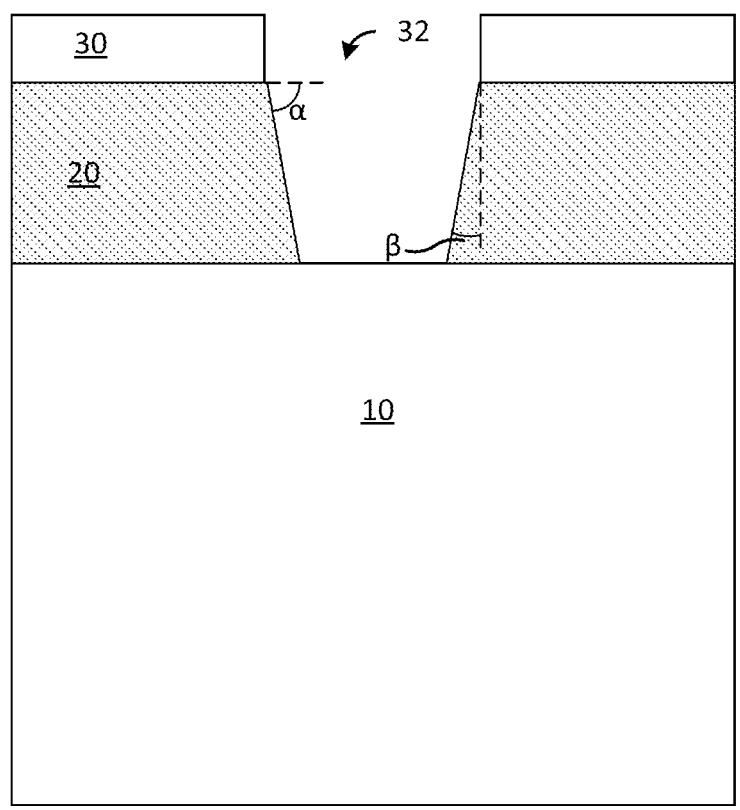
FIG. 4 illustrates a cross-sectional view of the semiconductor device during fabrication after patterning the auxiliary material in accordance with an embodiment of the present invention.

FIG. 4 illustrates a cross-sectional view of the semiconductor device during fabrication after patterning the auxiliary material in accordance with an embodiment of the present invention.

Referring to FIG. 4, the auxiliary layer 20 is patterned using the photo resist layer 30 as the etch mask to form the second opening 32 in the auxiliary layer 20. The second opening 32 exposes the underlying substrate 10.

In various embodiments, the auxiliary layer 20 is patterned using a plasma etching process, which may be a combination of reactive and ionic etching processes. In various embodiments, the auxiliary layer 20 and the photo resist layer 30 may be patterned in a single process chamber. In one embodiment, the auxiliary layer 20 and the photo resist layer 30 may be patterned using a same plasma etching process and chemistry.

In one or more embodiments, the plasma etching process is modified to produce sidewalls having a positive taper, i.e., in which the angle α is less than 90° (when angle α is equal to 90°, there is no taper). The plasma process may be adjusted to change the taper by controlling the anisotropy of the etching process.

In various embodiments, the taper angle may be adjusted by modifying the rate of deposition and etching in a plasma process. In a typical plasma process, both deposition and etching are competing processes. The deposition may include deposition of ions and species of the plasma as well as redeposition of the material that is being removed. For example, the material of the substrate that is being etched may be oxidized by the plasma and deposited on the sidewalls of the openings being formed. Depending on the material deposited, the deposited material may prohibit or reduce the etching of the sidewall thereby increasing the positive taper of the opening 32 being formed.

In further embodiments, the taper angle β may be adjusted by modifying the ratios of the reactive neutral species and the ionic species. The reactive neutral species may increase isotropic etching while the ionic species may increase the anisotropic etching.

In one or more embodiments, the process gas for the etching may be modified to change the taper angle. The process gas for the plasma etching comprises a first component having a high build-up of polymers during the plasma etching, and a second component having a low build-up of polymers during the plasma etching. The gas flow ratio of the first component relative to the second component is adjusted such that there is more of the first component than the second component. Thus, there is more build-up producing a positively tapered profile as shown. For example, in one embodiment, the first component comprises $CHF_3$ and the second component comprises $CF_4$. For obtaining a vertical profile, the process gas may be adjusted such that there is less of the first component than the second component.

Figure 5:
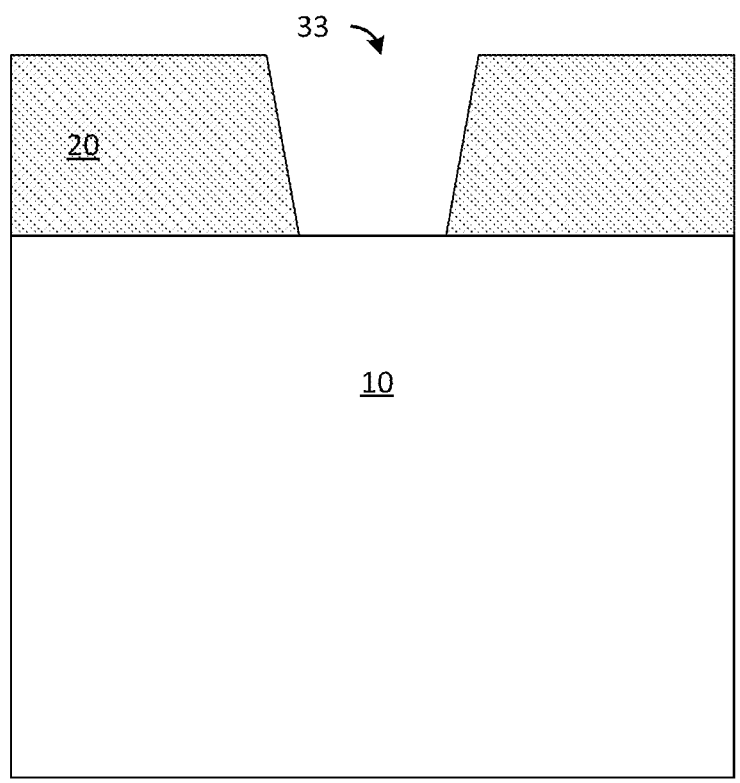
FIG. 5 illustrates a cross-sectional view of the semiconductor device during fabrication after removing the photo resist material in accordance with an embodiment of the present invention.

FIG. 5 illustrates a cross-sectional view of the semiconductor device during fabrication after removing the photo resist material in accordance with an embodiment of the present invention.

The photo resist layer 30 may be removed, for example, using a wet etching leaving a third opening 33 in the auxiliary layer 20.

Figure 6:
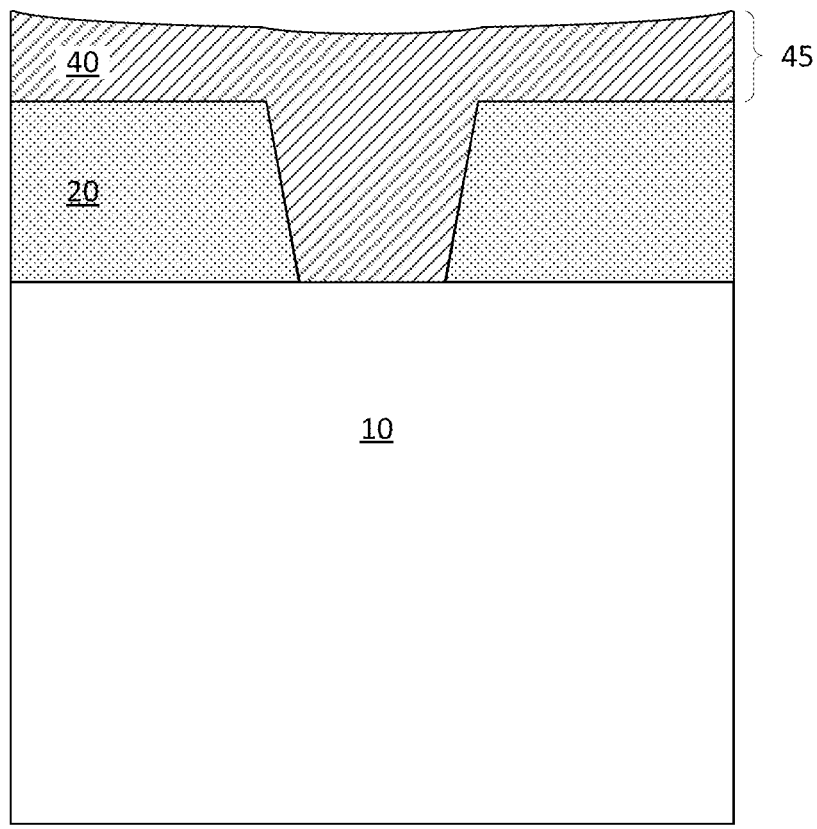
FIG. 6 illustrates a cross-sectional view of the semiconductor device during fabrication after filling the opening with a fill material in accordance with an embodiment of the present invention.

FIG. 6 illustrates a cross-sectional view of the semiconductor device during fabrication after filling the opening with a fill material in accordance with an embodiment of the present invention.

In one or more embodiments, a fill material 40 is deposited within the third opening 33. The fill material 40 is over-deposited to ensure completely filling the third opening 33 and to form an overfill layer 45.

In various embodiments, the fill material 40 comprises a doped oxide such as $SiO_2$ doped with boron and/or phosphorus. The silicon dioxide may be deposited using a chemical vapor deposition (CVD) process such as sub-atmospheric CVD or plasma enhanced CVD process in one embodiment.

The deposition process may comprise the use of a carrier gas, an oxidizing species, a silicon source, a boron source, and a phosphorus source in one or more embodiments. An example carrier gas is helium. The oxidizing species may comprise ozone, oxygen, $N_2O$, and NO. In various embodiments, the silicon source may be tetraethylorthosilane (TEOS), silane, or others.

Triethylphosphate (TEPO), triethylphosphite (TEPi), trimethylphosphate (TMOP), trimethylphosphite (TMPi), and similar compounds may be used a source for phosphorus. Similarly, trietbylborate (TEB), trimethylborate (TMB), and similar compounds may be used as a source for boron. In general, doped oxides which exhibit reflow behavior have a combined total doping of phosphorus and boron in the range of 4 to 9%.

After the fill material 40 (doped silicon oxide) is deposited, a subsequent heating is performed to reflow the oxide. The heating softens and flows the oxide relieving intrinsic stress as well as changing the stoichiometry of the oxide to a more stable composition. The substrate 10 may be heated so as to reduce the viscosity of the oxide. The heating process may be performed to about 400° C. in one embodiment, for example, between 400° C. to 600° C.

Figure 7:
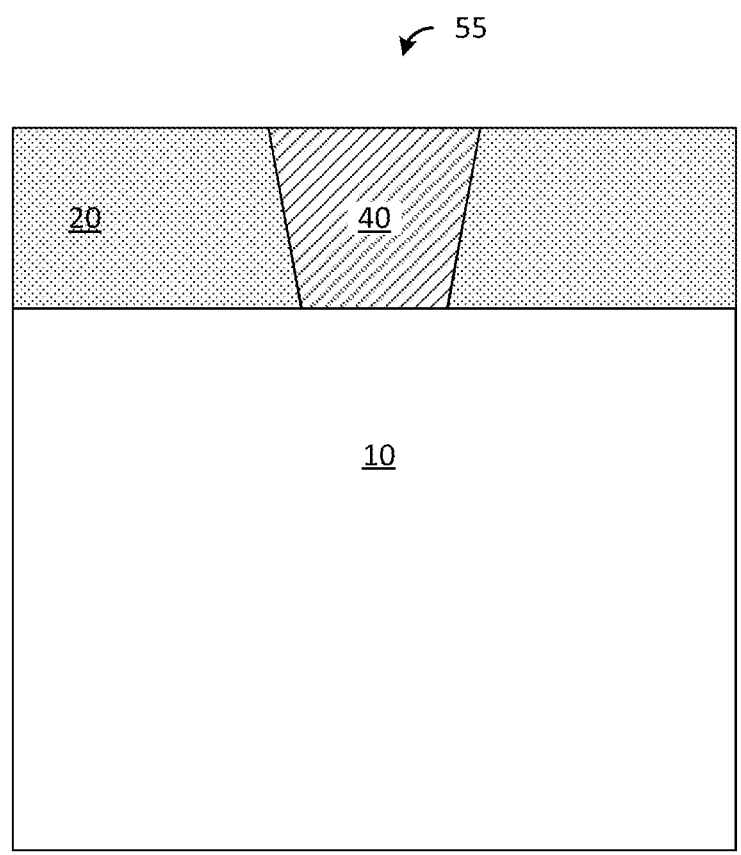
FIG. 7 illustrates a cross-sectional view of the semiconductor device during fabrication after planarizing the fill material in accordance with an embodiment of the present invention.

FIG. 7 illustrates a cross-sectional view of the semiconductor device during fabrication after planarizing the fill material in accordance with an embodiment of the present invention.

As illustrated in prior FIG. 6, after the reflow process, the fill material 40 has a non-uniform top surface due to filling the opening. In particular, the top surface of the fill material 40 over the third opening 33 is lower than a top surface of the fill material 40 over the auxiliary layer 20.

Referring to FIG. 7, a planarization process is performed. The planarization process may be a polishing process such as a chemical mechanical planarization (CMP) process in one embodiment. The CMP process is stopped after exposing a top surface of the auxiliary layer 20. A top portion of the auxiliary layer 20 may be removed by the CMP process before it is stopped in various embodiments. Accordingly, a dielectric structure 55 embedded within the auxiliary layer 20 is formed.

In some embodiments, the planarization may not be needed if the fill material 40 has a planar surface due to the deposition process being used. For example, as an illustration, the fill material 40 may be applied as a liquid using a spin coating process thereby forming a planar top surface. In such embodiment, an etching process may also be used to remove the overfill layer 45.

Figure 8A:
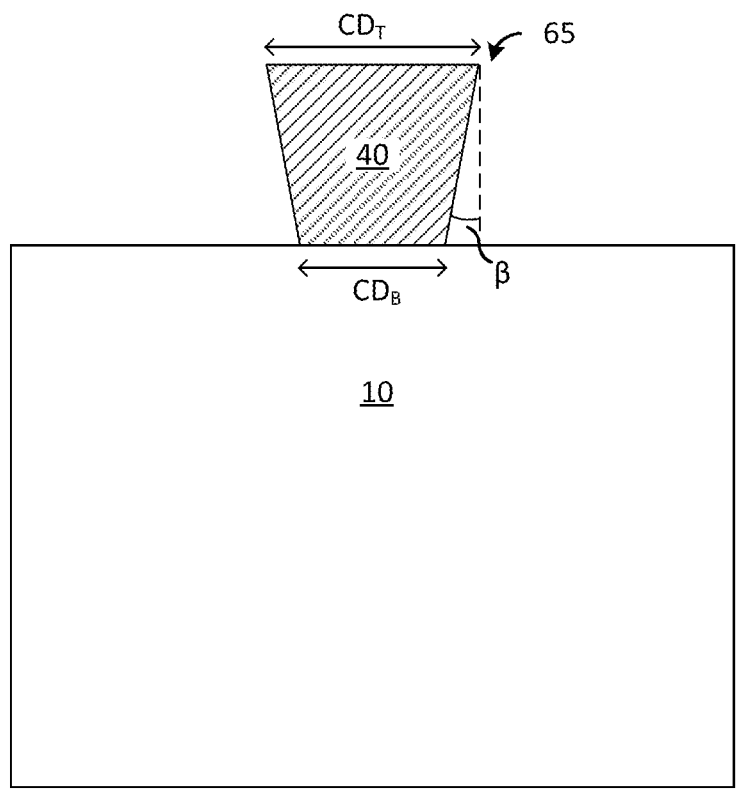
Figure 8B:
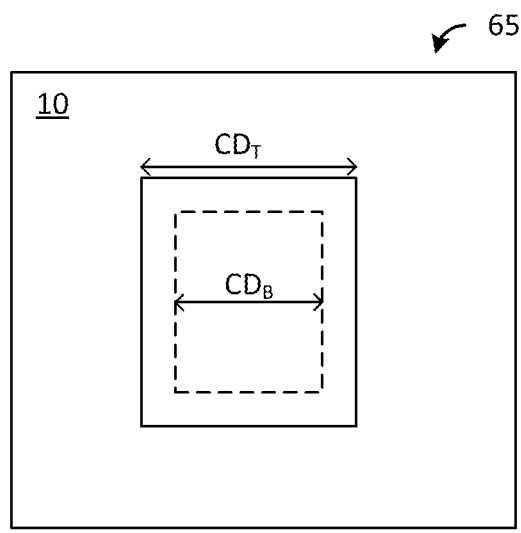

FIG. 8A illustrates a cross-sectional view of the semiconductor device during fabrication after removing the auxiliary layer in accordance with an embodiment of the present invention. FIG. 8B illustrates a corresponding top view of the semiconductor device.

The bottom critical dimension ($CD_B$) is less than the top CD ($CD_T$) resulting in the negative taper. The auxiliary layer 20 is removed leaving a dielectric structure 65 having a negative taper. Accordingly, using embodiments of the present invention a structure with negative taper is formed. In various embodiments, the taper angle β may be between 5° to 30°. In one or more embodiments, the taper angle β may be between 10° to 40°. In alternative embodiments, the taper angle β may be between 15° to 30°.

As illustrated in FIG. 8B, the negative taper may be formed in both directions along the length and the width directions.

Subsequent processing may continue as in conventional semiconductor processing.

Figure 9:
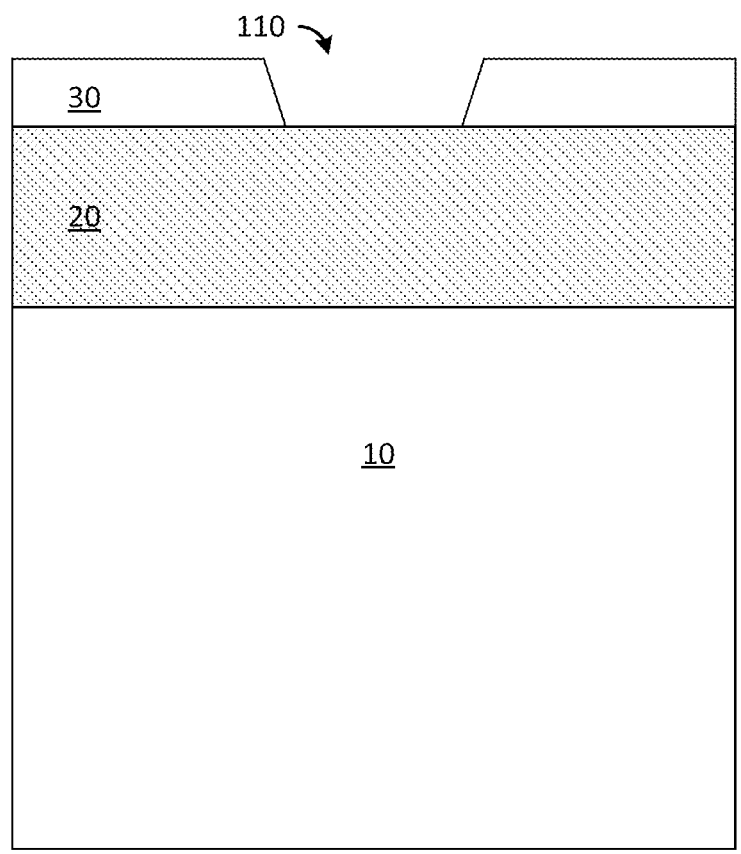
FIG. 9 illustrates a cross-sectional view of the semiconductor device during fabrication after patterning the photo resist layer with positive tapered sidewalls in accordance with an embodiment of the present invention.
Figure 10:
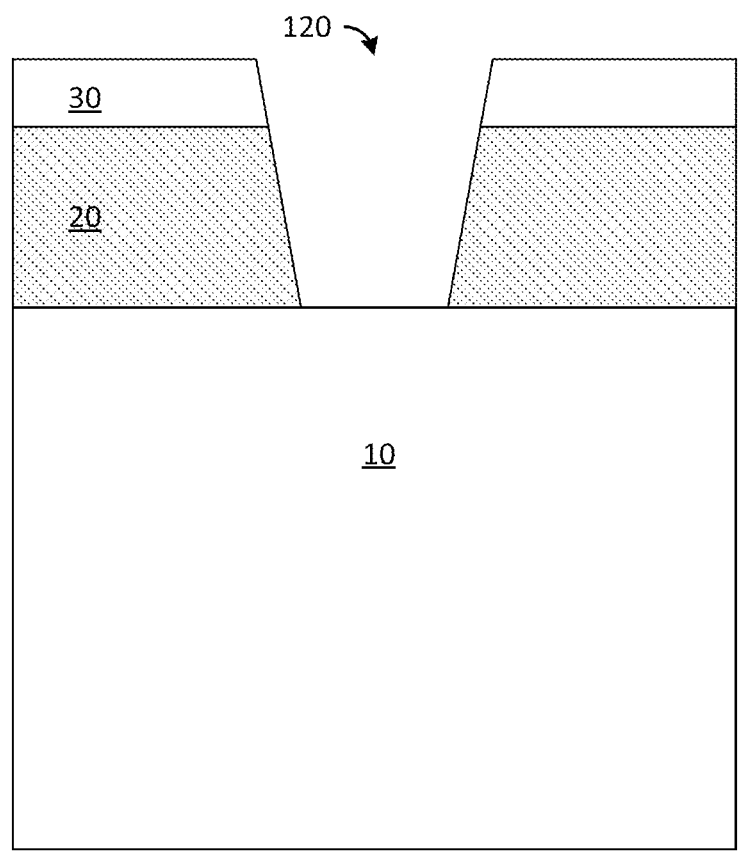
FIG. 10 illustrates a cross-sectional view of the semiconductor device during fabrication after etching the auxiliary layer in accordance with an embodiment of the present invention.

FIGS. 9-10 illustrate an alternative embodiment of the present invention in which the photo resist layer may also be formed with a positive taper.

This embodiment may follow the process illustrated in FIGS. 1-2.

FIG. 9 illustrates a cross-sectional view of the semiconductor device during fabrication after patterning the photo resist layer with positive tapered sidewalls in accordance with an embodiment of the present invention.

In one or more embodiments, the developing of the photo resist layer 30 may result in forming an opening 110 having a tapered sidewall. The positively tapered sidewall may be obtained by the lithographic processes which may include some resist reflow process step.

FIG. 10 illustrates a cross-sectional view of the semiconductor device during fabrication after etching the auxiliary layer in accordance with an embodiment of the present invention.

As described previously, the auxiliary layer 20 is etched using a plasma process to form a second opening 120 having tapered sidewalls. The presence of the tapered sidewalls of the photo resist layer 30 may help to increase the taper angle of the sidewalls of the auxiliary layer 20.

In various embodiments, a process sequence including a resist pullback may be used with a repetitive sequence of etching steps for the auxiliary layer 20 and mask pullback of mask layer 30. The sequence may include a short anisotropic dielectric etch (resulting a shallow, vertical profile) and a short isotropic resist etch (resulting in lateral resist pull-back and undesired resist thinning). The above sequence is repeated until the profile is etched completely and the resist is not completely consumed. At the end of such a process flow i.e. after complete etch of layer 20 the substrate 10 will be exposed and the mask layer 30 will be removed completely. Alternatively, a constant resist pullback during the plasma etching process may be applied if sufficient mask thickness is provided. In such a process, reactants eroding the resist isotropically have to be added to the etch chemistry used for auxiliary layer 20 during the etching.

Although, vertical resist profiles allow the fabrication of negative taper in dielectric layers (FIGS. 3-8), the plasma etching processes to form the auxiliary layer 20 are different for vertical resist profile (e.g., FIG. 3) and positively sloped resist profile (e.g., FIG. 9). In case of vertical resist profiles, the etching process for auxiliary layer 20 will be run with a higher percentage of process gases which will promote polymer build-up at the profile sidewalls to obtain positively tapered profiles in the auxiliary layer 20, for example. A $CHF_3/CF_4$ based etch chemistry will, for example, require a higher $CHF_3/CF_4$ gas flow ratio for the case of vertical resist profiles than for the case of positively tapered resist to finally end up with positively tapered profiles in the auxiliary layer 20.

Subsequent processes may follow as illustrated in FIGS. 5-8.

Figure 11:
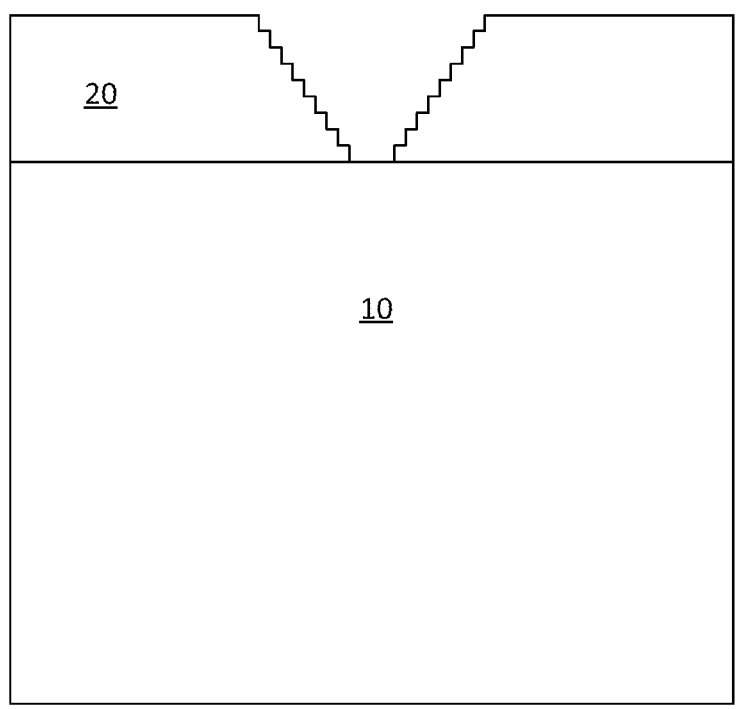
FIG. 11 illustrates a cross-sectional view of the semiconductor device during fabrication after removing the spacer after a multiple step etching process in accordance with an embodiment of the present invention.

FIG. 11 illustrates a cross-sectional view of the semiconductor device during fabrication after removing the spacer after a multiple step etching process in accordance with an embodiment of the present invention.

Embodiments of the present invention include a multiple step opening. For example, in various embodiments, a plurality of steps of partial etching, deposition of a sacrificial layer, forming a spacer, and etching further through the auxiliary layer may be repeated to form a ladder shaped opening within the auxiliary layer 20.

As an illustration a sequence comprising a plurality of repeated short anisotropic etching followed by isotropic etching may be repeated until the profile is etched. The resulting example structure is illustrated in FIG. 11.

An alternative is etching with a highly polymerizing etch chemistry in a single etch step, e.g., with a gas flow ratio of $CHF_3/CF_4$ greater than 1.

Figure 12:
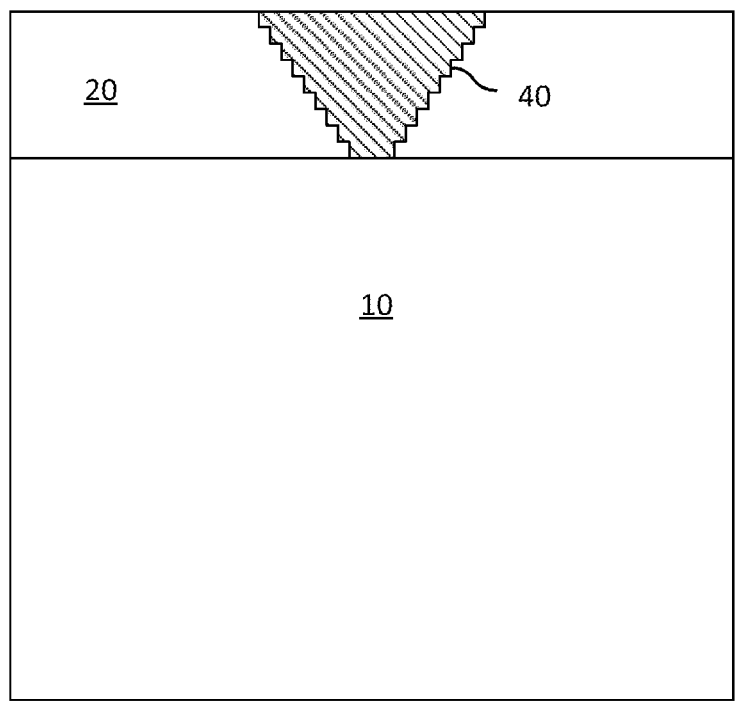
FIG. 12 illustrates a cross-sectional view of the semiconductor device during fabrication after filling the multiple step opening with a fill material in accordance with an embodiment of the present invention.

FIG. 12 illustrates a cross-sectional view of the semiconductor device during fabrication after filling the multiple step opening with a fill material in accordance with an embodiment of the present invention.

The fill material may be deposited into the opening and planarized as described in prior embodiments as shown in FIG. 12.

Figure 13:
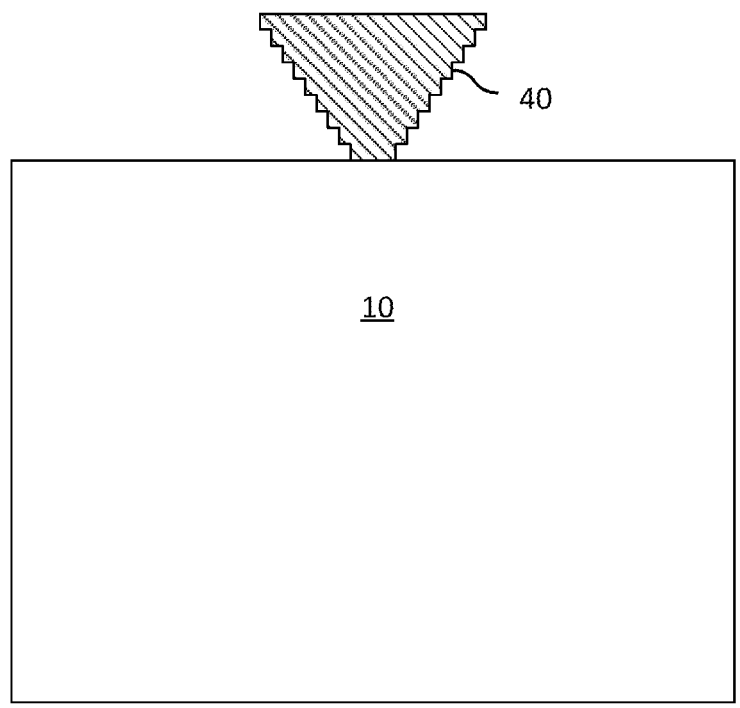
FIG. 13 illustrates a cross-sectional view of the semiconductor device during fabrication after removing the auxiliary layer in accordance with an embodiment of the present invention.

FIG. 13 illustrates a cross-sectional view of the semiconductor device during fabrication after removing the auxiliary layer in accordance with an embodiment of the present invention.

As illustrated in FIG. 13, the auxiliary layer 20 is removed leaving behind the dielectric structure comprising a negative taper.

Figure 14:
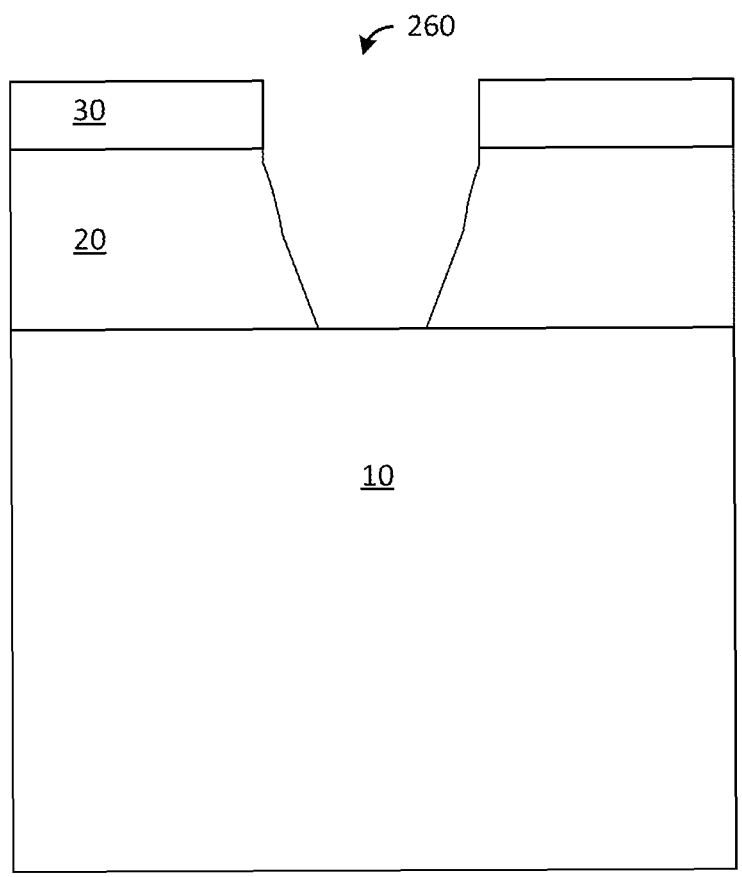
FIG. 14 illustrates a cross-sectional view of the semiconductor device during fabrication after an optional annealing process in accordance with an embodiment of the present invention.

FIG. 14 illustrates a cross-sectional view of the semiconductor device during fabrication after an optional annealing process in accordance with an embodiment of the present invention.

In various embodiments, an optional anneal may be performed to smooth the sidewalls of the auxiliary layer 20. For example, a high temperature may facilitate the movement of the atoms at sharp corners and promote corner rounding. Examples include annealing in a hydrogen atmosphere to increase the mobility of silicon atoms. The optional annealing may be performed in a rapid thermal annealing equipment or other furnace, for example, between 300° C. to 500° C.

Figure 15:
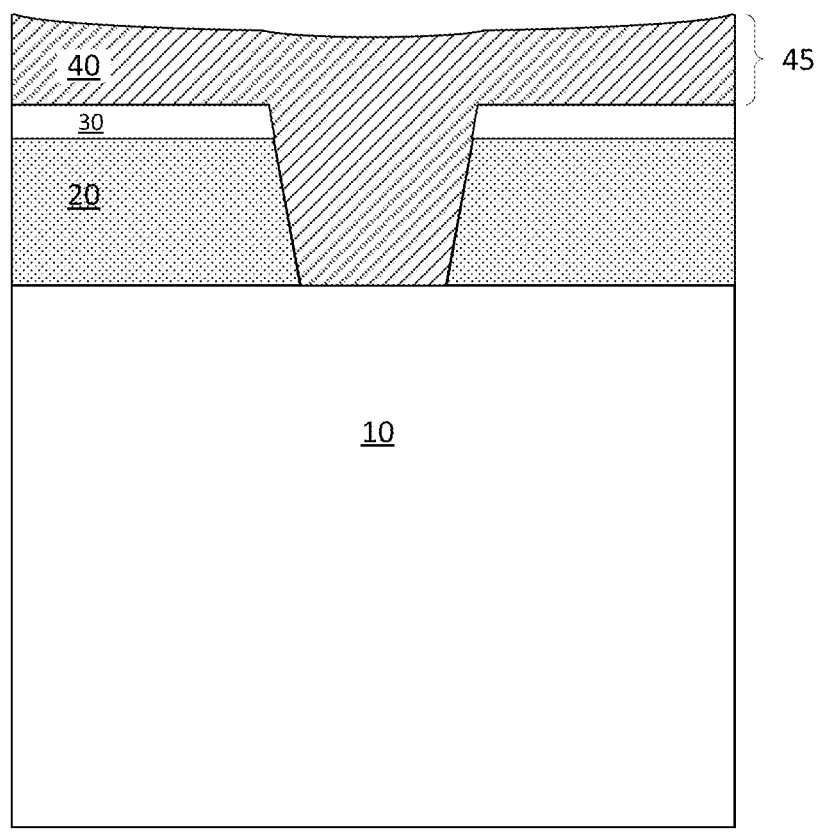
FIG. 15 illustrates a cross-sectional view of the semiconductor device during fabrication after depositing the fill material over a resist material in accordance with an embodiment of the present invention.
Figure 16:
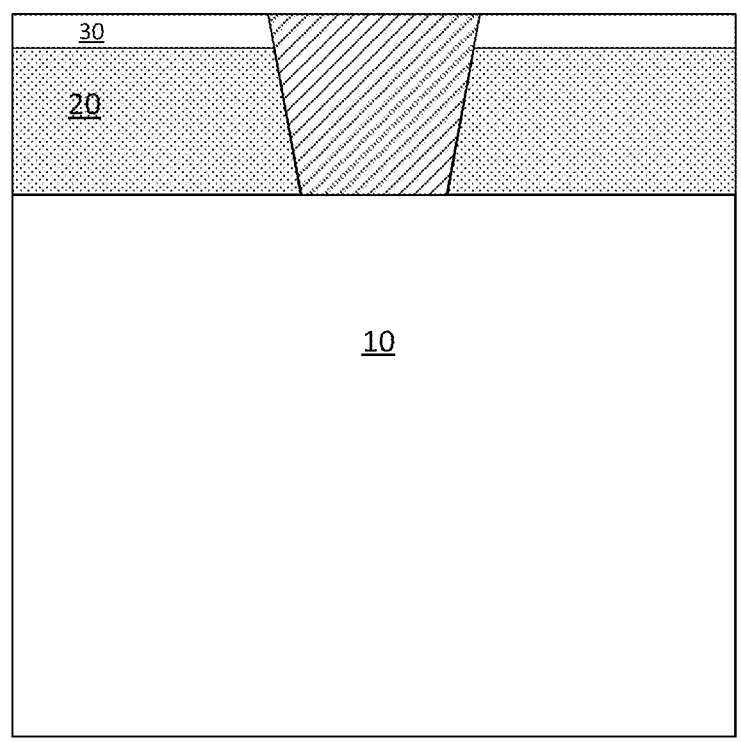
FIG. 16 illustrates a cross-sectional view of the semiconductor device during fabrication after a polishing process in accordance with an embodiment of the present invention.
Figure 17:
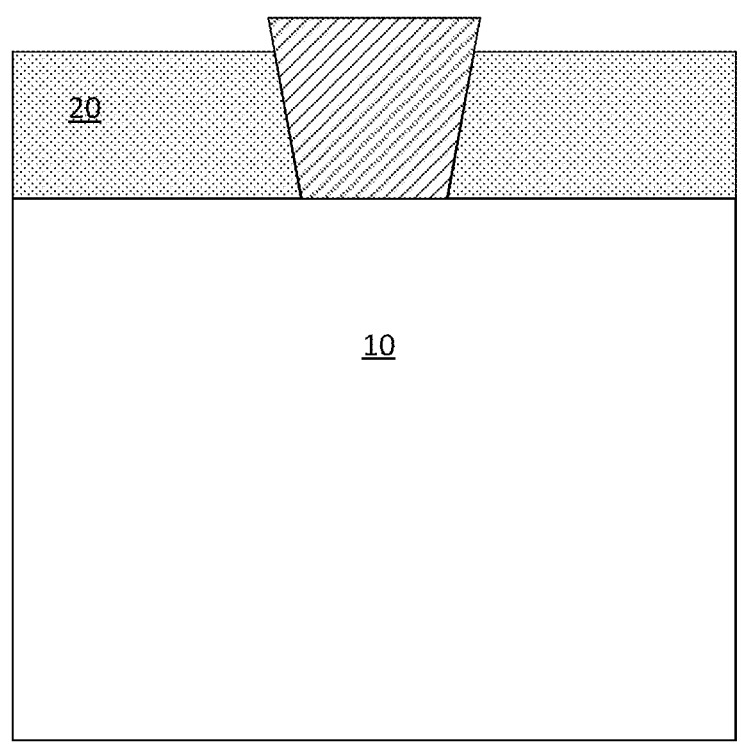
FIG. 17 illustrates a cross-sectional view of the semiconductor device during fabrication after removing any remaining photo resist layer in accordance with an embodiment of the present invention.
Figure 18:
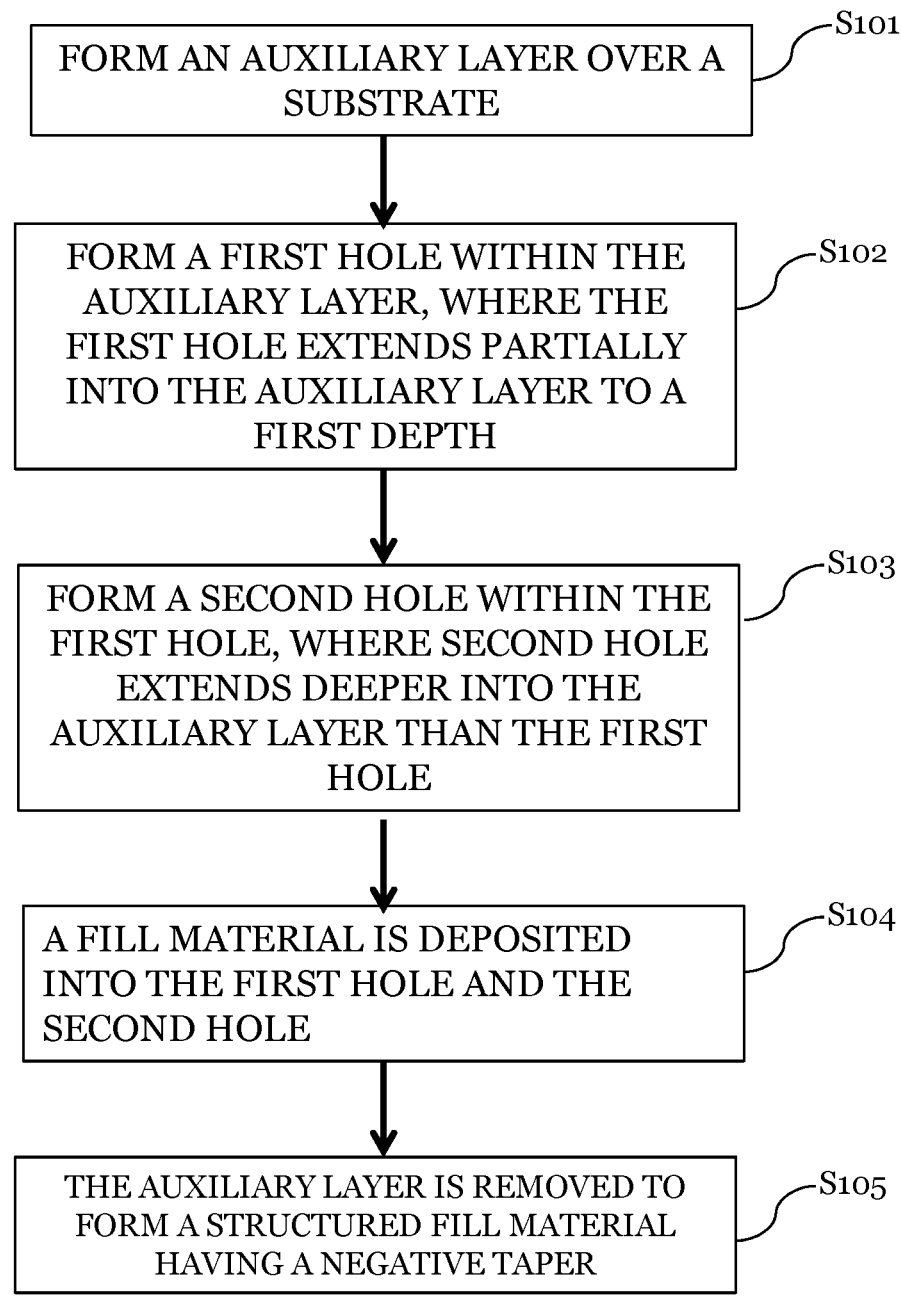
FIG. 18 describes a method for forming a dielectric structure in accordance with an embodiment of the present invention.

FIGS. 15-17 illustrate an alternative method of fabrication of the semiconductor device in which the fill material is deposited without removing the resist material.

This embodiment may follow the process described above, for example, in FIGS. 1-4. However, the photo resist layer 30 is not etched as in FIG. 5.

FIG. 15 illustrates a cross-sectional view of the semiconductor device during fabrication after depositing the fill material in accordance with an embodiment of the present invention.

The fill material 40 may be deposited directly over the photo resist layer 30 in one or more embodiments as illustrated in FIG. 19.

FIG. 16 illustrates a cross-sectional view of the semiconductor device during fabrication after a polishing process in accordance with an embodiment of the present invention.

The polishing or planarizing may be performed as in prior embodiments. The planarization process may remove the underlying resist layer 30 in or more embodiments. Alternatively, as illustrated in FIG. 16, a portion of the resist layer 30 may remain after the completion of the CMP process.

FIG. 17 illustrates a cross-sectional view of the semiconductor device during fabrication after removing any remaining photo resist layer in accordance with an embodiment of the present invention.

Any remaining photo resist layer 30 may be removed as shown in FIG. 16. The exposed auxiliary layer 20 may be then removed as described in prior embodiments. For example, subsequent processing may continue as illustrated in FIG. 8.

A method for forming a dielectric structure includes forming an auxiliary layer over a substrate (S101) and forming a first hole within the auxiliary layer, where the first hole extends partially into the auxiliary layer to a first depth (S102). A second hole is formed within the first hole, where second hole extends deeper into the auxiliary layer than the first hole (S103). A fill material is deposited into the first hole and the second hole (S104). The auxiliary layer is removed to form a structured fill material having a negative taper (S105).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a dielectric structure, the method comprising:
    forming an auxiliary layer over a substrate;
    forming a hole within the auxiliary layer using a plasma etching, wherein a process gas during the plasma etching comprises a first component having a high build-up of polymers during the plasma etching, and a second component having a low build-up of polymers during the plasma etching, wherein a gas flow ratio of the first component relative to the second component is such that there is more of the first component than the second component;
    depositing a fill material into the hole; and
    removing the auxiliary layer to form the dielectric structure having a negative taper, the dielectric structure having a top critical dimension (CD) greater than a bottom CD.

2. The method of claim 1, wherein the fill material deposited into the hole comprises a doped oxide.

3. The method of claim 1, wherein the plasma etching comprises a process parameter to produce a positive taper.

4. The method of claim 3, wherein the first component comprises $CHF_3$ and the second component comprises $CF_4$.

5. The method of claim 1, wherein forming the hole within the auxiliary layer comprises:
    forming a photo resist layer over the auxiliary layer;
    developing the photo resist layer to form an opening; and
    etching the auxiliary layer using the photo resist layer as an etch mask.

6. The method of claim 5, wherein the opening comprises a sidewall with positive taper.

7. The method of claim 5, wherein the opening comprises a sidewall with no taper.

8. The method of claim 5, further comprising removing the photo resist layer before depositing the fill material into the hole.

9. The method of claim 5, further comprising depositing the fill material over the photo resist layer, and removing the photo resist layer after depositing the fill material into the hole.

10. A method for forming a dielectric structure, the method comprising:
    forming an auxiliary layer over a substrate;
    forming a hole within the auxiliary layer using etching, wherein a process gas during the etching comprises a first component having a high build-up of polymers during the etching, and a second component having a low build-up of polymers during the etching, wherein a gas flow ratio of the first component relative to the second component is such that there is less of the first component than the second component;
    depositing a fill material into the hole; and
    removing the auxiliary layer to form the dielectric structure having a negative taper, the dielectric structure having a top critical dimension (CD) greater than a bottom CD.

11. A method for forming a dielectric structure, the method comprising:
    forming a hole within an auxiliary layer using a plasma etching, the hole having positive tapered sidewalls, wherein a process gas during the plasma etching comprises a first component having a high build-up of polymers during the plasma etching, and a second component having a low build-up of polymers during the plasma etching, wherein a gas flow ratio of the first component relative to the second component is such that there is more of the first component than the second component;
    depositing a doped oxide into the hole and contacting the hole; and
    removing the auxiliary layer to form a structured fill material having negative tapered sidewalls.

12. A method for forming a dielectric structure, the method comprising:
    forming an auxiliary layer over a substrate;
    forming a first hole within the auxiliary layer using a plasma etching, the first hole extending partially into the auxiliary layer to a first depth;
    forming a second hole within the first hole, the second hole extending deeper into the auxiliary layer than the first hole, wherein a process gas during the plasma etching comprises a first component having a high build-up of polymers during the plasma etching, and a second component having a low build-up of polymers during the plasma etching, wherein a gas flow ratio of the first component relative to the second component is such that there is a different amount of the first component than the second component;
    depositing a fill material into the first hole and the second hole; and
    removing the auxiliary layer to form a structured fill material having a negative taper.

13. The method of claim 12, wherein the structured fill material comprises top critical dimension (CD) greater than a bottom CD.

14. The method of claim 12, further comprising:
    forming a third hole within the second hole, the third hole extending deeper into the auxiliary layer than the second hole, wherein depositing the fill material into the first hole and the second hole comprises depositing the fill material into the third hole.

15. The method of claim 12, wherein forming the auxiliary layer comprises forming an opening comprises a sidewall with positive taper.

16. The method of claim 15, wherein a gas flow ratio of the first component relative to the second component is such that there is more of the first component than the second component.

17. The method of claim 15, wherein the opening comprises a sidewall with no taper.

18. The method of claim 17, wherein a gas flow ratio of the first component relative to the second component is such that there is less of the first component than the second component.

* * * * *